(12) United States Patent
Leupold

(10) Patent No.: US 6,320,488 B1
(45) Date of Patent: Nov. 20, 2001

(54) MAGIC CYLINDER ADJUSTABLE IN FIELD STRENGTH

(75) Inventor: Herbert A. Leupold, Eatontown, NJ (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 0 days.

(21) Appl. No.: 09/629,756

(22) Filed: Jul. 31, 2000

(51) Int. Cl.$^7$ ........................................................ H01F 7/02
(52) U.S. Cl. ................................................................ 335/306
(58) Field of Search ..................................... 335/296–306; 324/318, 319, 320; 315/5.34, 5.35; 372/2

(56) References Cited

U.S. PATENT DOCUMENTS

| | | | | |
|---|---|---|---|---|
| 5,034,715 | * | 7/1991 | Leupold et al. ...................... | 335/306 |
| 5,068,860 | * | 11/1991 | Hartemann et al. ...................... | 372/2 |
| 5,332,971 | * | 7/1994 | Aubert .................................. | 324/319 |

* cited by examiner

*Primary Examiner*—Ramon M. Barrera
(74) *Attorney, Agent, or Firm*—Michael Zelenka; George B. Tereschuk

(57) ABSTRACT

A permanent magnet structure that produces a working magnetic field having a field-strength that can be mechanically adjusted. In general, the permanent magnet structure includes at least four permanent magnet shells that are assembled such that the magnetic fields they produce interact with each other in a working space to form the working magnetic field. Two of the four permanent magnet shells are magnetized such that they interact to produce a magnetic field (a first field) in the working space. The other two permanent magnet shells are magnetized such that they interact to produce a magnetic field (a second field) having a given field strength in the working space. The first and second fields interact in the working space to form the working magnetic field. Further, the four permanent magnet shells are arranged such that the relative position of each shell with respect to the other shells can be changed by mechanically moving any one of the shells. The working field thereby has a field-strength that depends on the relative position of the permanent magnet shells with respect to each other so that the field-strength of the working magnetic field can be adjusted.

7 Claims, 2 Drawing Sheets

MAGIC CYLINDER ADJUSTABLE IN FIELD STRENGTH

GOVERNMENT INTEREST

The invention described herein may be manufactured, used, and licensed by or for the Government for governmental purposes without the payment to me of any royalty thereon.

FIELD OF THE INVENTION

The present invention relates to the field of permanent magnet structures and, more particularly, to permanent magnet structures that produce an adjustable working magnetic field.

BACKGROUND OF THE INVENTION

Permanent magnet structures that produce a working magnetic field are well known in the art. The term "working magnetic field" as used herein refers to a magnetic field that is used to do a useful task. A magnetic field used to guide or focus an electron beam is an example of such a working magnetic field.

Some permanent magnet structures are composed of pieces of permanent magnet material arranged to form a shell having an interior cavity. Each piece of permanent magnet material has a magnetization that adds to the overall magnetization of the shell. Depending on the magnetization of the shell, a permanent magnet structure can be designed to produce a working magnetic field having a given magnitude parallel to a given axis in the cavity of the shell.

Some permanent magnet structures are designed to provide a working magnetic field having a magnitude or strength that can be mechanically adjusted. Such structures are typically composed of two permanent magnet shells, each producing a working magnetic field in their respective cavities. The shells are arranged such that their internal cavities share a common space, thereby forming a common internal cavity. Such an arrangement enables the working magnetic fields to interact in the common internal cavity to produce, e.g. by vector addition, a composite working magnetic field having a composite magnitude. In addition, the shells are arranged such that they can rotate independent of each other around the common internal cavity. The "rotatability" enables one to change the vector relationship between the working magnetic fields produced by each shell. As a result, the magnitude of the composite working field in the common internal cavity can be adjusted or changed by rotating one shell with respect to the other.

One such adjustable permanent magnet structure is described in U.S. Pat. No. 4,862,128, entitled "Field Adjustable Transverse Flux Source," issued to the present inventor herein on Aug. 29, 1989, and incorporated herein by reference. As described therein, an adjustable working magnetic field can be obtained by assembling two cylindrical shells or "magic rings" such that one is embedded within the other so that they are axially aligned and the outer radius of the inner shell equals the inner radius of the outer shell. By rotating the shell of the outer magic ring around the inner magic ring, the magnitude of the working magnetic field in the cavity can be adjusted or changed without having to change the magnetization of either shell. Thus one has a structure that can be adjusted to produce a uniform magnetic field with any value in between, and including $2H_1$, where $H_1$ is the field produced by each cylindrical shell acting alone.

SUMMARY OF THE INVENTION

The present invention is directed to a permanent magnet structure that produces a tapered working magnetic field having a magnitude and pitch that can be mechanically adjusted.

To attain this, a permanent magnet structure in accordance with the principles of the present invention is composed of four or more permanent magnet shells. A first set of shells are oriented and magnetized such that they interact to produce a first working magnetic field. A second set of shells are oriented and magnetized such that they interact to produce a second magnetic field having a given magnitude. Both sets of permanent magnet shells are assembled such that they share a common internal cavity wherein the first and second working fields interact with each other to form a tapered working magnetic field. In addition, the first and second sets of permanent magnet shells are arranged such that they can be mechanically rotated around the common internal cavity. As described above, a mechanical movement or rotation of any one of the sets of shells directly affects the interaction (geometric addition) of the magnetic fields produced by the sets of shells, and thus directly affects both the magnitude and/or pitch of the tapered working magnetic field produced in the common internal cavity. As a result, one can adjust or change the pitch of the magnetic field in the common internal cavity by changing or rotating the relative position of one set of shells with respect to the other set of shells. Thus, in accordance with the principles of the present invention, the permanent magnet structure advantageously provides a working field having an adjustable magnitude.

In particular embodiments, the permanent magnet structure is composed of two sets of permanent magnet shells, each set being composed of two hollow substantially cylindrical shells that form a common internal cavity. Each set having one shell embedded within the other such that they are axially aligned and such that the outer radius of one is equal to the inner radius of the other. The sets of shells are arranged such that one set of shells is embedded within the other such that they are axially aligned and such that the outer radius of one set is equal to the inner radius of the other. The shells of one set are magnetized such that they produce a first working magnetic field having a given magnitude in the common internal cavity. The other set of rings are magnetized such that they produce a second working field having a given taper in the common internal cavity. The first and second working fields interact in the common internal cavity to form a composite working magnetic field having a given magnitude. The magnitude and pitch of the composite working magnetic field can thereby be adjusted by rotating the shells within each set of shells and/or by rotating one set of shells with respect to the other.

Although there may be a residual transverse field emanating inward or outward from the diametric axis along which the composite internal field is generated, the transverse field will be negligible on the axis where the work is actually done. These and other features of the invention will become more apparent from the Detailed Description when taken with the drawing. The scope of the invention, however, is limited only by the claims.

DETAILED DESCRIPTION

Figure 1:
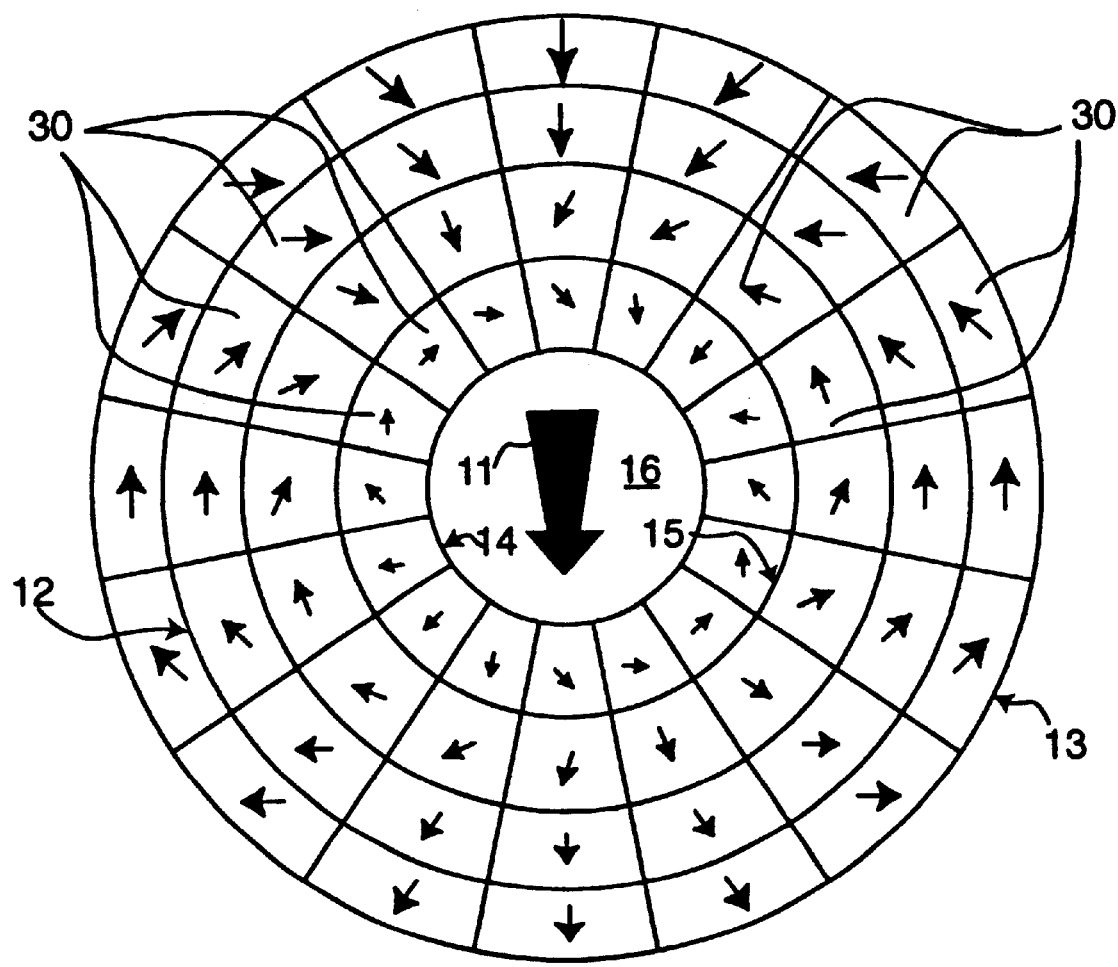
FIG. 1 is a cross-sectional view of an illustrative embodiment of a permanent magnet structure producing a working field having an adjustable field strength [and pitch] in accordance with the principles of the present invention.

Referring now to FIG. 1, there is shown an illustrative embodiment of a permanent magnet structure 10 that produces a working field 11 having an adjustable field-strength in accordance with the principles of the present invention. As shown, permanent magnet structure 10 is composed of four concentric permanent magnet rings 12–15. Permanent magnet rings 12–15 are adjustable or rotatable such that the relative position of each ring with respect to the other rings can be changed by mechanically adjusting or rotating at least one of the permanent magnet rings.

Each permanent magnet ring 12–15 is composed of smaller permanent magnet pieces or segments 30 having a given magnetization (magnitude and direction of remenance). The permanent magnet segments 30 of a given permanent magnet ring 12–15 interact to generate a magnetic field in working space 16. Thus, it can be understood that each permanent magnet ring 12–15 independently generates a magnetic field in working space 16.

The magnetic fields produced by permanent magnet rings 14 and 15 interact in working space 16 to produce a first component field having a given magnitude or field-strength. The given field-strength is determined by the geometric interaction (addition) of the magnetization (magnitude and direction of remenance) of the permanent magnet segments 30 of permanent magnet 14 and 15. Thus, a change in the relative position of permanent magnet ring 14 with respect to permanent magnet ring 15 will change the interaction (addition) of the magnetizations (mangitude and direction of remenance) of their permanent magnet segments 30. Such a change in the interaction of the permanent magnet segments 30 can result in a change in the field-strength of the first component field produced by permanent magnet rings 14 and 15 in working space 16.

The first component field (produced by permanent magnet rings 14 and 15 ) and second component field (produced by permanent magnet rings 12 and 13 ) interact in working space 16 to form working magnetic field 11. Working field 11 thereby has a field-strength dependent on the given field-strength of the first and second component fields. Since the field strength of the first and second component fields can be changed by an adjustment to the relative positions of permanent magnet rings 12–15, the field strength of working field 11 can also be changed by such an adjustment. Thus, in accordance with the principles of the present invention, permanent magnet structure 10 provides a working field having an adjustable field-strength.

Methods for making permanent magnet rings 12–15 are well known in the art. The present inventor is not claiming to be the inventor of such permanent magnet rings. Rather, the present inventor has found that such rings can be combined in the manner described above to form a permanent magnet structure that produces a working magnetic field having an adjustable field-strength.

One method of making permanent magnet rings 14 and 15, which produce a working magnetic field having an adjustable field strength, is shown and described in U.S. Pat. No. 4,862,128, issued to the present inventor on Aug. 29, 1989. As described therein, design procedures known to those skilled in the art permit one to calculate the magnetic field strength within the central cavity of the ring when the inner and outer radii of the ring are known, together with the remenance, B, of the magnetic material comprising the ring. In addition, it is described therein that the magnetic fields of two concentric rings add vectorialy to form a composite field. Thus, it can be appreciated that by changing the relative positions of the two concentric rings, the vectorial addition of the two magnetic fields can result in a composite ring having a different field-strength than it had before the change in position.

Figure 2:
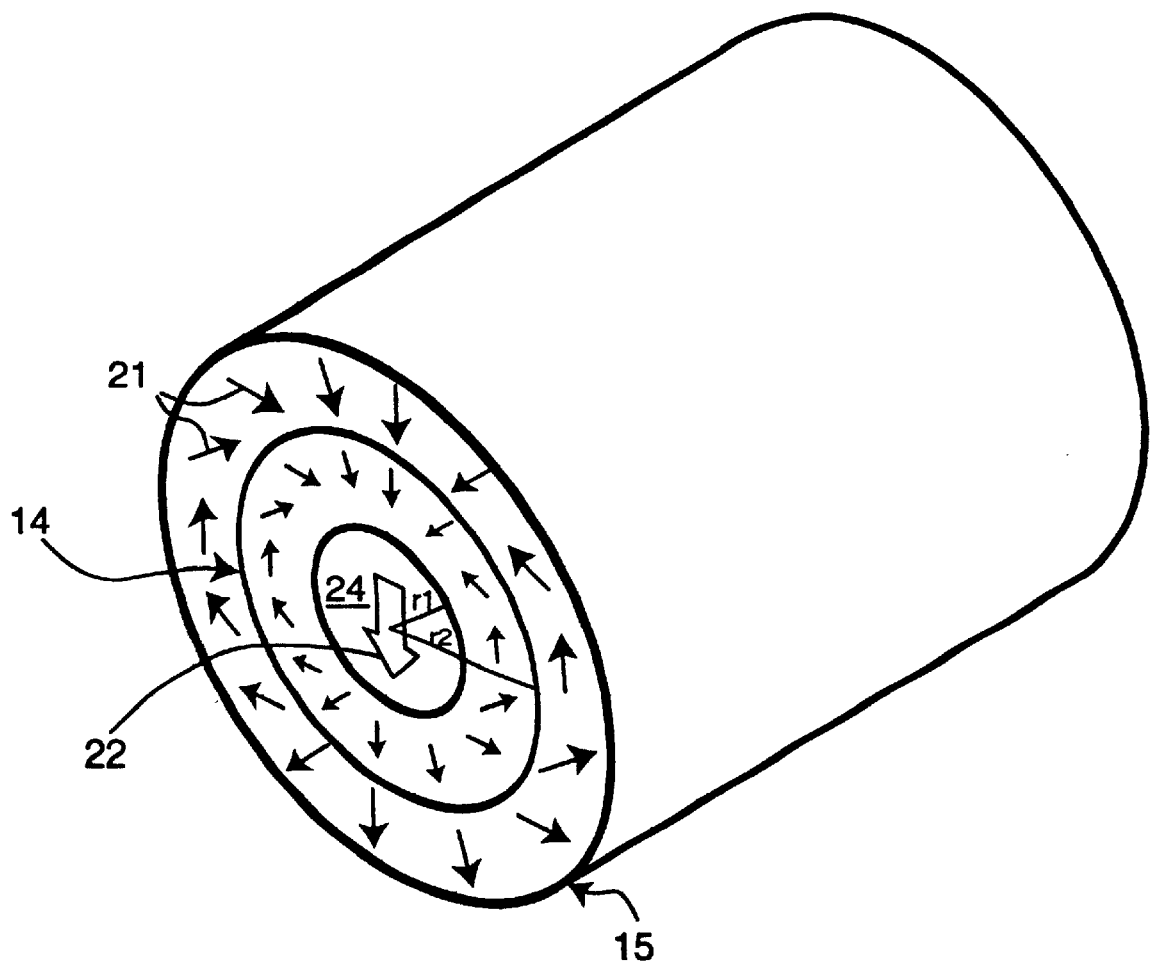
FIG. 2 is a perspective schematic diagram of embedded, axially aligned hollow cylindrical flux source structures, or rings, that combine to produce a working magnetic field having an adjustable magnitude.

FIG. 2 shows an illustrative embodiment of rings 14 and 15. As shown, ring 14 is embedded within ring 15 such that they are axially aligned and the outer radius of ring 14 equals the inner radius of ring 15. Arrows 21 indicate the magnetization of the permanent magnet pieces that comprise rings 14 and 15 . As described above, the magnetization of the permanent magnet pieces combine or add to form working field 22 in cavity 24. The design procedures known to those skilled in the art permit one to calculate the magnetic field strength produced by each ring 14 and 15 when the inner and outer radii, r1 and r2 respectively, of the ring are known and the remenance, B, of the permanent magnet pieces comprising the ring are known. For example, for an ideal, infinitely long ring, the magnetic field strength, H, of the working field is given by the equation:

$$H = B_r \ln(r_2/r_1)$$

Thus, the magnetic field strength H produced by each ring 14 and 15 add geometrically to form working field 22. In addition, since rings 14 and 15 are free to rotate about the central axis independent of the motion of the other, the resulting field strength of working field 22 can be adjusted without having to change the magnetizations of the permanent magnet pieces that comprise rings 14 and 15 .

Similarly, methods of making permanent magnet rings 12 and 13 are well known in the art. One method of making permanent magnet rings 12 and 13 is shown and described in U.S. Pat. No. 5,216,400, issued to the present inventor on Jun. 1, 1993. As described therein, a ring that produces a tapered working field can be made by making a permanent magnet ring composed of permanent magnet pieces having different magnetizations (i.e. different magnitude and direction of remenance) at different locations along the ring. The magnetization $B(\theta)$ of the permanent magnet pieces vary as a function of the polar angle $\theta$ in accordance with the equation:

$$B(\theta) = [B(\text{Max}) - B(\text{Min})][\theta/\pi] + B(\text{Min})$$

where B(Max) is the maximum remanence available among the suitable materials, and B(Min) is the remanence appropriate to produce a field H(Min) at the low end of the taper of the working magnetic field. By varying the magnetization of the permanent magnet pieces in this manner, a working field can be produced in a cavity. Thus, it can be appreciated that by embedding one shell within another shell the working fields they produce can vectorially add in the cavity to produce a composite working field.

Referring now back to FIG. 1, it can be now be appreciated that rotating permanent magnet ring 14 with respect to permanent magnet ring 15 around cavity 16 can produce a change in the magnitude of working field 11 in working space 16.

While the invention has been particularly shown and described with reference to permanent magnet structure 10 shown in FIG. 1, it will be recognized by those skilled in the art that modifications and changes may be made to the present invention without departing from the spirit and scope thereof. In addition, in particular embodiments, a permanent magnet structure in accordance with the principles of the present invention may have a spherical shape or any other desired shape. Also, in particular embodiments, a permanent magnet structure in accordance with the principles of the present invention can be composed of any number of rotatable shells including at least four shells. As a result, the invention in its broader aspects is not limited to specific details shown and described herein. Various modifications may be made without departing from the spirit or scope of the general inventive concept as defined by the appended claims.

Also, it should be noted that the terms and expressions used herein are used as terms of description and not of limitation, and there is no intention, in the use of such terms and expressions, of excluding any equivalents of the features shown and described or any portions thereof.

What is claimed is:

1. A permanent magnet structure comprising:

a first shell of magnetic material forming a cylindrical hollow cavity, said magnetic material of said shell being magnetized such that said first shell produces a first working magnetic field in said cavity, said first working magnetic field having a given magnitude and direction in said cavity;

a second shell of magnetic material positioned concentrically within said first shell, said magnetic material of said second shell being magnetized such that said second shell produces a second working magnetic field in said cavity, said second working magnetic field having a given magnitude and direction in said cavity;

said first and second working magnetic fields combining in said cavity to produce a first composite working field having a given magnitude and direction, said first and second shells being rotatable with respect to each other such that said given magnitude and direction of the first composite working field can be adjusted by rotating said first and second shells with respect to each other;

a third shell of magnetic material positioned concentrically within said second shell, said magnetic material of said third shell being magnetized such that said third shell produces a third working field in said cavity, said third working field having a given direction in said cavity;

a fourth shell of magnetic material positioned concentrically within said third shell, said magnetic material of said fourth shell being magnetized such that said fourth shell produces a fourth working field in said cavity, said fourth working field having a given direction in said cavity;

said first, second, third and fourth shells are magic rings; and said third and fourth working fields combining in said cavity to produce a second composite working field having a given direction in said cavity, said third and fourth shells being rotatable with respect to each other such that the given direction of the second composite working field can be adjusted by rotating said third and fourth shells with respect to each other, said first and second composite working fields combining in said cavity to form a final composite working field having an adjustable magnitude.

2. The permanent magnet structure of claim 1, further comprising said four shells comprise four concentric permanent magnet rings, each ring having an interior, said interior of each ring sharing a common space, said final composite working magnetic field being generated in said common space.

3. The permanent magnet structure of claim 2 wherein each permanent magnet ring generates a magnetic field in said common space, said magnetic fields interacting to produce said final composite working magnetic field.

4. The permanent magnet structure of claim 3, further comprising a first two of said permanent magnet rings are magnetized such that the magnetic fields generated in said common space interact to produce said first composite working field.

5. The permanent magnet structure of claim 4, further comprising the other two permanent magnet rings are magnetized such that the magnetic fields they generate in said common space interact to produce said second composite working field.

6. The permanent magnet structure of claim 5, further comprising the field-strength of the working magnetic field to be changed by an adjustment in the relative position of at least one of said magic rings with respect to the other magic rings.

7. A permanent magnet structure comprising:

a first pair of permanent magnet shells, each shell having an interior in which it generates a magnetic field, said magnetic fields interacting to generate a first composite magnetic field having a given magnitude in a common space, the relative position of said first pair of permanent magnet shells being adjustable with respect to each other such that the given magnitude of the first composite magnetic field is adjustable by changing the relative position of one of said permanent magnet shells with respect to the other;

a second pair of permanent magnet shells, each shell having an interior in which it generates a magnetic field, said magnetic fields interacting to generate a second composite magnetic field in said common space;

said first and second pair of permanent magnet shells being composed of magic rings arranged concentrically; and the relative position of said second pair of permanent magnet shells being adjustable with respect to each other by changing the relative position of one of said permanent magnet shells with respect to the other, said first composite magnetic field and said second composite magnetic field interacting to form a working field having an adjustable magnitude in said common space.

* * * * *